(12) United States Patent
Wang et al.

(10) Patent No.: US 10,261,640 B2
(45) Date of Patent: Apr. 16, 2019

(54) EMBEDDED TOUCH PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengpeng Wang, Beijing (CN); Xue Dong, Beijing (CN); Hailin Xue, Beijing (CN); Haisheng Wang, Beijing (CN); Xiaochuan Chen, Beijing (CN); Xiaoliang Ding, Beijing (CN); Shengji Yang, Beijing (CN); Yingming Liu, Beijing (CN); Weijie Zhao, Beijing (CN); Hongjuan Liu, Beijing (CN); Changfeng Li, Beijing (CN); Wei Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 156 days.

(21) Appl. No.: 15/149,404

(22) Filed: May 9, 2016

(65) Prior Publication Data
US 2017/0075450 A1 Mar. 16, 2017

(30) Foreign Application Priority Data
Sep. 11, 2015 (CN) .......................... 2015 1 0580674

(51) Int. Cl.
*G06F 3/044* (2006.01)
*G06F 3/041* (2006.01)
*H01L 27/32* (2006.01)

(52) U.S. Cl.
CPC ............ *G06F 3/044* (2013.01); *G06F 3/0412* (2013.01); *G06F 3/0416* (2013.01); *H01L 27/323* (2013.01)

(58) Field of Classification Search
CPC ...... G06F 3/044; G06F 3/0412; G06F 3/0416; H01L 27/323
See application file for complete search history.

(56) References Cited

U.S. PATENT DOCUMENTS

2007/0242055 A1* 10/2007 Lai .................. G06F 3/0412
345/173
2011/0102331 A1* 5/2011 Philipp .................. G06F 3/047
345/173
(Continued)

FOREIGN PATENT DOCUMENTS

| CN | 104536636 | 4/2015 |
|---|---|---|
| CN | 104881179 | 9/2015 |

OTHER PUBLICATIONS

Office action from corresponding Chinese Application No. 201510580674.8, dated Jul. 11, 2017 (5 pages).

*Primary Examiner* — Ricardo Osorio
(74) *Attorney, Agent, or Firm* — Harness, Dickey & Pierce, PLC

(57) ABSTRACT

The present disclosure discloses an embedded touch panel and display device. The embedded touch panel comprises an upper substrate, a lower substrate opposite to the upper substrate, multiple pixel units disposed on a plane of the lower substrate facing the upper substrate, wherein each of the pixel units comprises a bottom-emitting OLED pixel structure and a pixel circuit; a plurality of independent self-capacitance electrodes disposed between the lower substrate and the pixel units and insulated from the pixel units; a touch sensing chip which determines a touch position by detecting a change in capacitance of each of the self- (Continued)

capacitance electrodes during a touch duration; and wires disposed between the lower substrate and the OLED pixel structure, each of the wires corresponding to each of the self-capacitance electrodes and connecting the self-capacitance electrode to the touch sensing chip.

16 Claims, 6 Drawing Sheets

(56) References Cited

U.S. PATENT DOCUMENTS

| | | | |
|---|---|---|---|
| 2012/0169636 A1* | 7/2012 | Liu | G06F 3/0412 |
| | | | 345/173 |
| 2012/0306812 A1* | 12/2012 | Lai | G06F 3/0412 |
| | | | 345/174 |
| 2015/0084023 A1 | 3/2015 | Sato | |
| 2016/0240593 A1* | 8/2016 | Gu | G09G 3/3225 |
| 2016/0343771 A1* | 11/2016 | Bower | H01L 21/77 |
| 2016/0357310 A1* | 12/2016 | Wang | G06F 3/0412 |
| 2017/0123542 A1* | 5/2017 | Xie | H01L 21/77 |
| 2017/0147112 A1* | 5/2017 | Wang | G06F 3/0412 |
| 2017/0177139 A1 | 6/2017 | Yang et al. | |

* cited by examiner

EMBEDDED TOUCH PANEL AND DISPLAY DEVICE

CROSS-REFERENCE TO RELATED APPLICATION

This application claims the benefit and priority of Chinese Patent Application No. 201510580674.8 filed Sep. 11, 2015. The entire disclosure of the above application is incorporated herein by reference.

FIELD

The present disclosure relates to an embedded touch panel and display device.

BACKGROUND

This section provides background information related to the present disclosure which is not necessarily prior art.

Organic light emitting diode (OLED) display is one of hot spots in the research area of flat panel display. As compared with liquid crystal display (LCD), OLED display has several advantages such as low power consumption, low production cost, self-luminescence, wide view angle, quick response and etc. Currently, it is a trend that OLED display replaces conventional LCD in, for example, mobile phone, PDA, digital camera and the like.

With rapid development of the display technology, touch screen panel is getting increasingly popular in people's daily life. According to its composition and structure, the touch screen panel may be currently divided into add on mode touch panel, on cell touch panel and embedded touch panel (also referred as in cell touch panel). The add on mode touch panel, which is manufactured by separately fabricating the touch panel and the display panel and then laminating them together, has disadvantages such as high fabricating cost, low light transmittance, thick module or the like. In contrast, the embedded touch panel is becoming increasingly popular with the panel manufacturer due to the facts that it is compatible with the current display panel technology as the touch electrodes for the touch panel can be embedded inside the display panel.

Currently, all in cell touch panels used in the OLED display are based on a top-emitting OLED pixel structure. As shown in FIG. 1, the top-emitting OLED pixel structure comprises a lower substrate 1 and an upper substrate 2 opposite to the upper substrate, and multiple pixel units arranged in a matrix on the lower substrate 1, each of the pixel units including a pixel circuit 3 (the specific structure of which is not shown in FIG. 1) and a top-emitting OLED pixel structure 4, wherein the top-emitting OLED pixel structure 4 comprises an anode layer 41, an organic light-emitting layer 42 and a cathode layer 43 sequentially layered on the lower substrate 1. The cathode layer 43 may also be reused as a self-capacitance electrode. However, since the respective self-capacitance electrodes need to be connected to a peripheral circuit via a wire 5, the wires 5 and the electrodes (the specific structure of which is not shown in FIG. 1) in the pixel circuit 3 must be fabricated at the same layer in order to simplify masking process. As a result, the wires 5 have to penetrate multiple layers including the organic light-emitting layer 42 and the anode layer 41 in order to be electrically connected to the cathode layer 43 reused as the self-capacitance electrode, leading to a relatively complicated manufacturing process and high production cost.

SUMMARY

This section provides a general summary of the disclosure, and is not a comprehensive disclosure of its full scope or all of its features.

An embedded touch panel and display device provided by embodiments of the present disclosure make it possible to decrease the manufacturing complexity and lower down the production cost because there is no longer any need for the electrical connection between the wire and the self-capacitance electrode to penetrate the OLED pixel structure.

According to an aspect of the present disclosure, there is provided an embedded touch panel comprising:

an upper substrate;

a lower substrate opposite to the upper substrate;

multiple pixel units disposed on a plane of the lower substrate facing the upper substrate, wherein each of the pixel units comprises a bottom-emitting OLED pixel structure and a pixel circuit;

a plurality of independent self-capacitance electrodes disposed between the lower substrate and the pixel units and insulated from the pixel units;

a touch sensing chip which determines a touch position by detecting a change in capacitance of each of the self-capacitance electrodes during a touch duration; and wires disposed between the lower substrate and the OLED pixel structure, each of the wires corresponding to each of the self-capacitance electrodes and connecting the self-capacitance electrode to the touch sensing chip.

According to an embodiment of the present disclosure, the self-capacitance electrode is in a grid shape.

According to an embodiment of the present disclosure, the self-capacitance electrode is made of metal.

According to an embodiment of the present disclosure, the embedded touch panel further comprises a black matrix area disposed between the upper substrate and the lower substrate and between the adjacent OLED pixel structures, wherein a positive projection of the black matrix area onto the lower substrate covers a positive projection of the self-capacitance electrode onto the lower substrate.

According to an embodiment of the present disclosure, the self-capacitance electrode is made of a transparent electrically conductive material.

According to an embodiment of the present disclosure, the self-capacitance electrode is in block shape and a positive projection of the self-capacitance electrode onto the lower substrate covers a positive projection of at least one of the pixel units onto the lower substrate.

According to an embodiment of the present disclosure, each of the wires is arranged at the same layer as an electrode in the pixel circuit and made of the same material as the electrode in the pixel circuit, and wherein each of the wires is electrically connected to the corresponding self-capacitance electrode through a via hole.

According to an embodiment of the present disclosure, the wire is arranged at the same layer and made of the same material as the self-capacitance electrode.

According to an embodiment of the present disclosure, the embedded touch panel further comprises an insulation layer between the self-capacitances electrode and the pixel units.

According to an embodiment of the present disclosure, the OLED pixel structure comprises an anode layer, an organic light-emitting layer and a cathode layer, which are sequentially layered on the insulation layer.

According to an embodiment of the present disclosure, the OLED pixel structure further comprises a pixel defining layer disposed around the anode layer and the organic light-emitting layer.

According to an embodiment of the present disclosure, the embedded touch panel further comprises a thin-film transistor disposed between the insulation layer and the OLED pixel structure, wherein the thin-film transistor comprises a gate, a gate insulation layer, an active layer, a source and a drain, which are sequentially disposed on the insulation layer, and wherein the source and the drain are formed at the same layer.

According to an embodiment of the present disclosure, the embedded touch panel further comprises a planarization layer disposed between the OLED pixel structure and the gate insulation layer.

According to an embodiment of the present disclosure, the wire is arranged at the same layer as the gate, and wherein the wire is electrically connected to the self-capacitance electrode through a via hole extending through the insulation layer.

According to an embodiment of the present disclosure, the anode layer is electrically connected to the drain through a via hole extending through the planarization layer.

According to another aspect of the present disclosure, there is provided a display device comprising any of the above described embedded touch panels.

In the embedded touch panel and the display device according to the embodiments of the present disclosure, by adopting the bottom-emitting OLED pixel structure, providing self-capacitance electrodes between the pixel unit and the lower substrate, and arranging the wire between the lower substrate and the OLED pixel structure, there is no need for the electrical connection between the wire and the self-capacitance electrode to penetrate the OLED pixel structure, thus reducing complexity of the manufacturing process and lowering down the production cost.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7b is an input sequence diagram corresponding to the pixel circuit shown in FIG. 7a.

Corresponding reference numerals indicate corresponding parts or features throughout the several views of the drawings.

DETAILED DESCRIPTION

Figure 1:
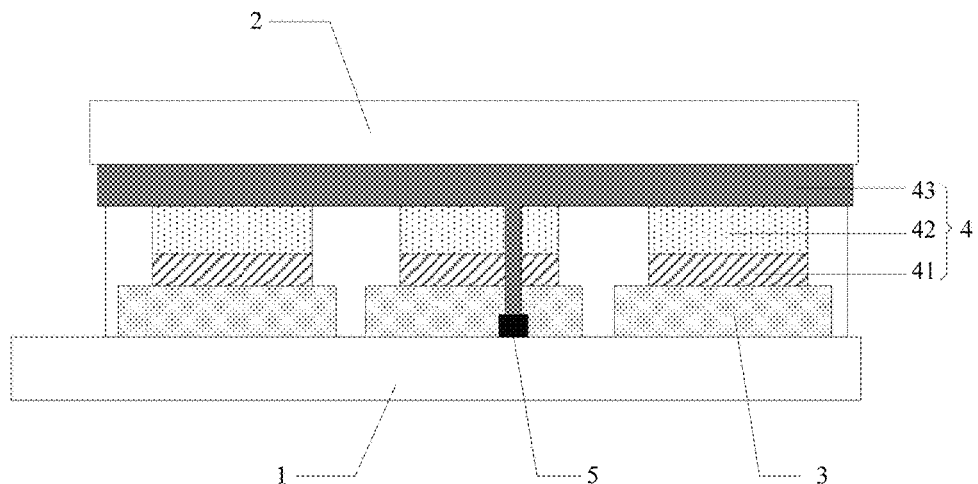
FIG. 1 is a schematic view illustrating structure of the existing embedded touch panel.

Example embodiments will now be described more fully with reference to the accompanying drawings.

Now specific embodiments of the embedded touch panel and the display device according to the present disclosure will be described in more details in connection with the drawings.

It should be noted that the thickness and shape of the various film layers illustrated in the drawings are for illustrative purpose only and do not reflect real scale of the embedded touch panel.

Figure 2:
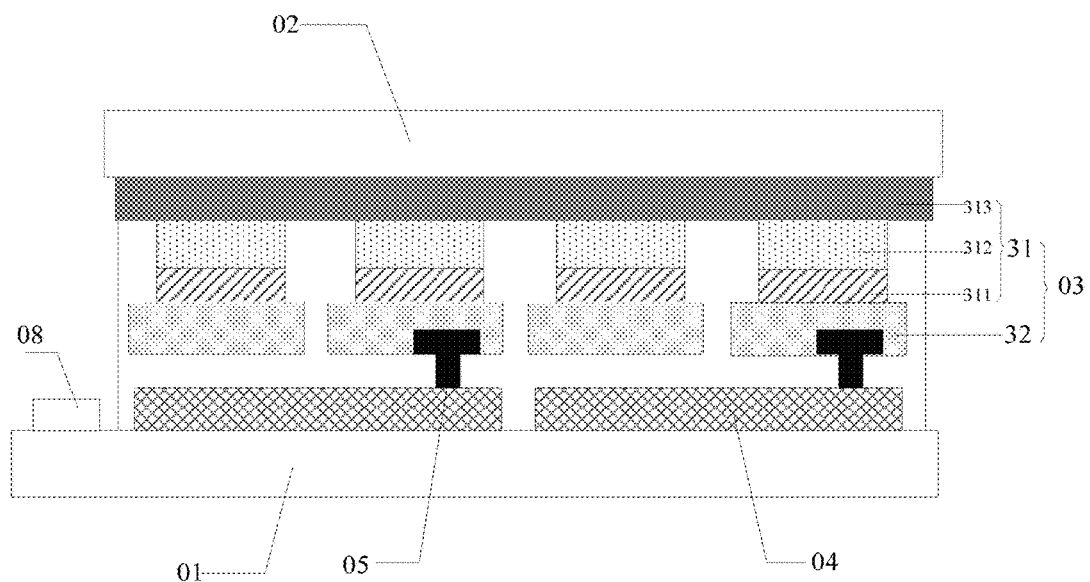
FIG. 2 is a schematic view illustrating structure of the embedded touch panel according to an embodiment of the present disclosure.

As shown in FIG. 2, an embedded touch panel according to an embodiment of the present disclosure comprises an upper substrate 02, a lower substrate 01, and multiple pixel units 03 disposed on a plane of the lower substrate 01 facing the upper substrate 02, wherein the upper substrate 02 and the lower substrate 01 face each other and each of the pixel units 03 comprises a bottom-emitting OLED pixel structure 31 and a pixel circuit 32. The embedded touch panel further comprises: a plurality of self-capacitance electrodes 04 independent from each other and disposed between the lower substrate 01 and the pixel units 03 and insulated from the pixel units 03; a touch sensing chip 08 for determining a touch position by detecting variation in capacitance value of each of the self-capacitance electrodes 04 during touch duration, the touch sensing chip 08 positioned on the plane of the lower substrate 01 facing the upper substrate 02; and a wire 05 disposed between the lower substrate 01 and the OLED pixel structure 31 and corresponding to each of the self-capacitance electrodes 04, and used for connecting the self-capacitance electrodes 04 to the touch sensing chip.

In the embedded touch panel according to the embodiments of the present disclosure, by adopting the bottom-emitting OLED pixel structure 31, providing self-capacitance electrodes between the pixel units 03 and the lower substrate 01, and arranging the wire 05 between the lower substrate 01 and the OLED pixel structure 31, there is no need for the electrical connection between the wire 05 and the self-capacitance electrode 04 to penetrate the OLED pixel structure 31, thus reducing complexity of the manufacturing process and lowering down the production cost.

Figure 3:
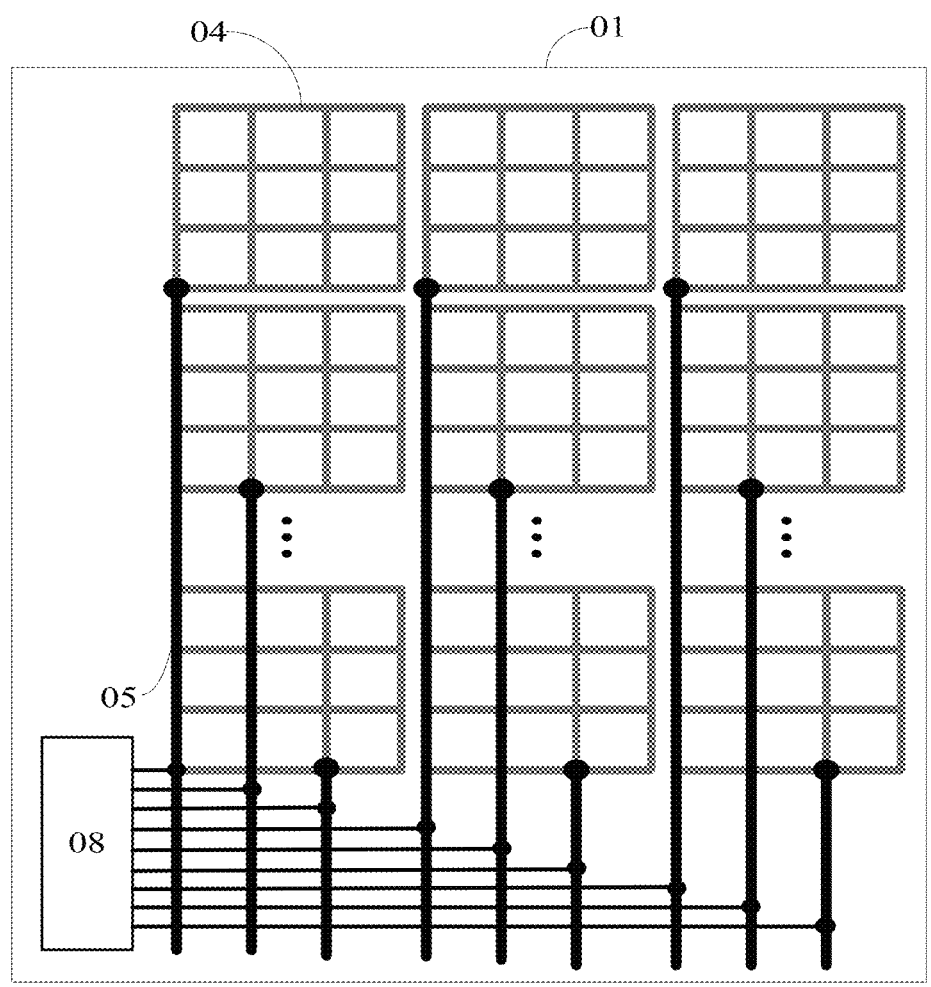
FIG. 3 is a schematic view illustrating structure of the self-capacitance electrode according to an embodiment of the present disclosure.

According to an embodiment of the present disclosure, as shown in FIG. 3, the self-capacitance electrode 04 in the embedded touch panel is in a grid shape in order to avoid affecting the aperture ratio by the self-capacitance electrode.

According to an embodiment of the present disclosure, the self-capacitance electrodes in the embedded touch panel may be made of metal. Since the metal has reduced resistivity, the electrical resistance of the self-capacitance electrodes can be reduced, thus enhancing touch sensitivity of the touch panel.

Because the metal material forming the self-capacitance electrodes is generally light proof, it may be desirable to, for example, arrange the self-capacitance electrodes below the black matrix area, in order to avoid affecting the aperture ratio due to the fact that the self-capacitance electrodes made of metal may block the light emitted from the OLED structure.

The embedded touch panel according to an embodiment of the present disclosure further comprises a black matrix area disposed between the upper substrate and the lower substrate and between adjacent OLED pixel structures, wherein a positive projection of the black matrix area onto the lower substrate covers a positive projection of the self-capacitance electrode onto the lower substrate.

According to an embodiment of the present disclosure, the self-capacitance electrodes of the embedded touch panel may be made of a transparent electrically conductive material, so that there is no need to worry that the self-capacitance electrodes may reduce the aperture ratio.

Figure 4:
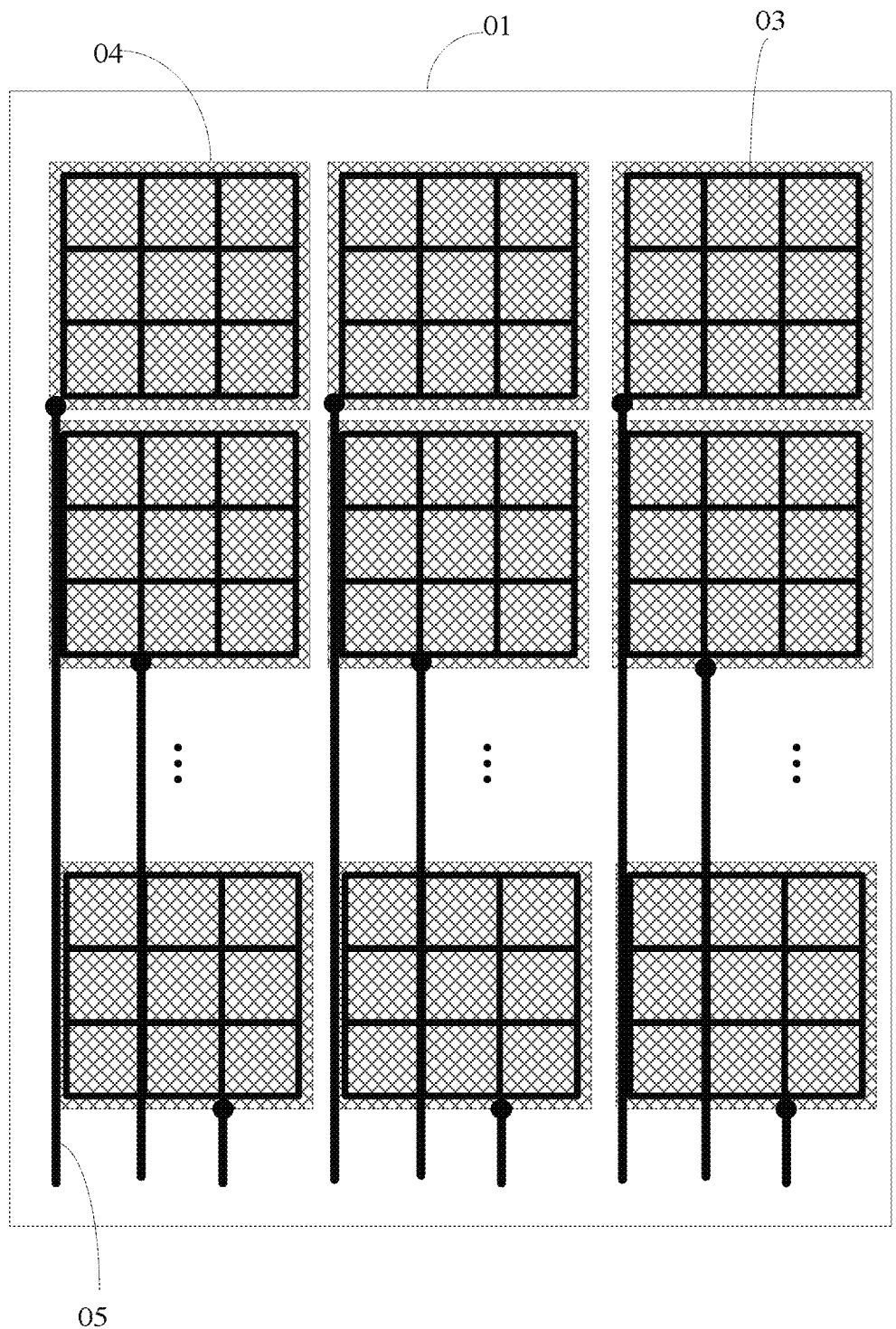
FIG. 4 is a schematic view illustrating structure of the self-capacitance electrode according to another embodiment of the present disclosure.

Therefore, according to an embodiment of the present disclosure shown in FIG. 4, when the self-capacitance electrode of the embedded touch panel is made of a transparent electrically conductive material, the self-capacitance electrode 04 may be in block shape and a positive projection of the self-capacitance electrode 04 onto the lower substrate covers a positive projection of at least one of the pixel units 03 onto the lower substrate. Increasing the area of the self-capacitance electrode in this way makes it possible to reduce resistance of the self-capacitance electrode, thus enhancing touch sensitivity of the touch panel.

In general, the density of the touch panel is of a millimeter level. Therefore, the density and area of the respective self-capacitance electrodes may be selected according to desired touch density. According to an embodiment of the present disclosure, each of the self-capacitance electrodes is designed as a rectangular electrode having an area of about 5 mm*5 mm. Since the density of the display panel is usually of a micron level, one self-capacitance electrode usually corresponds to multiple pixel units in the display panel.

The pixel circuit according to an embodiment of the present disclosure may be of the same structure as the existing pixel circuit, i.e., it may comprise a plurality of thin-film transistors and capacitors. The present disclosure does not make restriction to this.

Figure 5:
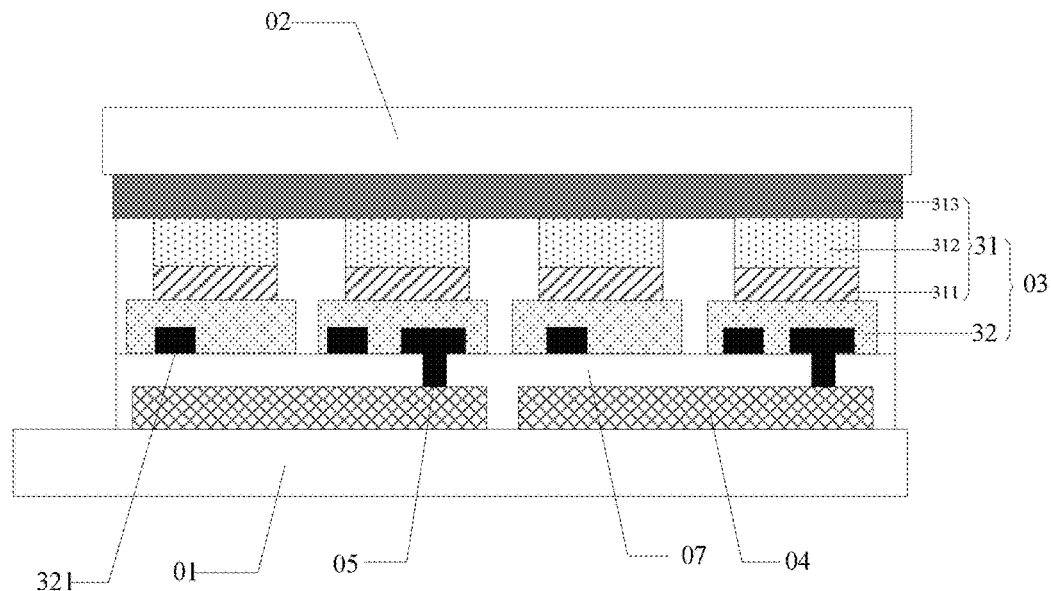
FIG. 5 is a schematic view illustrating structure of the embedded touch panel according to another embodiment of the present disclosure.

According to an embodiment of the present disclosure, as shown in FIG. 5, each of the wires 05 in the embedded touch panel may be formed at the same layer and made of the same material as an electrode 321 in the pixel circuit 32 and insulated from each other, and each of the wires 05 is electrically connected to the corresponding self-capacitance electrode 04 through a via hole. As such, it is possible to form the wire 05 simultaneously when forming the electrode 321 simply by modifying the pattern of the electrode in the pixel circuit 32 on the basis of the existing array substrate fabrication process, without any additional process. Accordingly, the production cost is reduced while the productivity is increased.

It would be appreciated that the electrode 321 in the pixel circuit 32 may be a source, a drain or a gate of the thin-film transistor in the pixel circuit 32, or an electrode of the capacitor in the pixel circuit. The present disclosure does not make restriction to this.

Alternatively, according to an embodiment of the present disclosure, it is also possible to form the wire in the embedded touch panel at the same layer and of the same material as the self-capacitance electrode, in order to reduce manufacturing steps and production cost. As a result, the embodiments of the present disclosure can be implemented simply by modifying the pattern of the corresponding film layer, without introducing any new additional process. Accordingly, the manufacturing process is simplified, the production cost is reduced while the productivity is increased.

According to an embodiment of the present disclosure, when the wire in the embedded touch panel is made of metal, it may be desirable to arrange the wire within the projection area of the black matrix area (i.e., the positive projection of the black matrix area onto the lower substrate covers the positive projection of the wire onto the lower substrate), so as to avoid affecting the aperture ratio.

As shown in FIG. 5, the embedded touch panel according to an embodiment of the present disclosure further comprises an insulation layer 07 disposed between the self-capacitance electrodes 04 and the pixel units 03, whereby the pixel units 03 and the self-capacitance electrodes 04 are insulated from each other.

In the embedded touch panel according to an embodiment of the present disclosure, the OLED pixel structure is the same as the existing bottom-emitting OLED pixel structure. As shown in FIG. 5, the OLED pixel structure 31 comprises an anode layer 311, an organic light-emitting layer 312 and a cathode layer 313, which are sequentially layered on the insulation layer 07. Herein detailed description will be omitted.

Now the position of the wire in the embedded touch panel according to an embodiment of the present disclosure will be described with reference to a particular embodiment.

Figure 6:
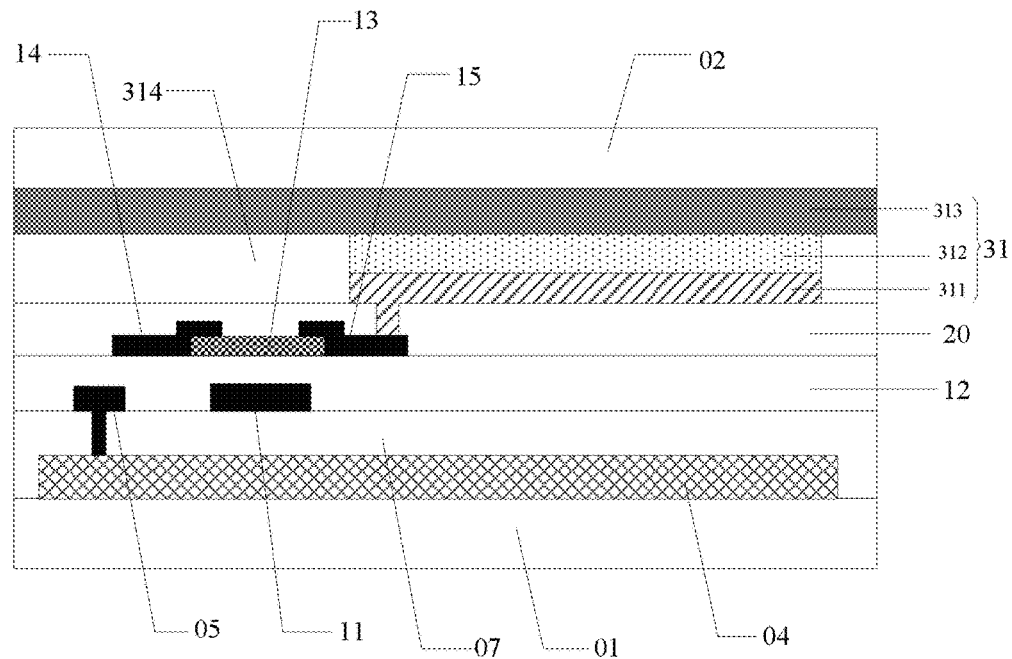
FIG. 6 is a schematic view illustrating specific structure of the embedded touch panel according to an embodiment of the present disclosure.

Here we take one pixel unit as an example. Also, the figures only show one thin-film transistor in the pixel circuit. As shown in FIG. 6, a self-capacitance electrode 04, an insulation layer 07, a thin-film transistor and a wire 5, a planarization layer 20, and an OLED pixel structure 31 are successively formed on the lower substrate 01. The thin-film transistor comprises a gate 11, a gate insulation layer 12, an active layer 13, and a source 14 and a drain 15 formed at the same layer, all of which are sequentially layered on the insulation layer 07. The OLED pixel structure 31 comprises an anode layer 311, an organic light-emitting layer 312 and a cathode layer 313 sequentially layered on the planarization layer 20. The OLED pixel structure 31 further comprises a pixel defining layer 314 disposed around the anode layer 311 and the organic light-emitting layer 312. The wire 05 and the gate 11 are arranged at the same layer, the wire 05 is electrically connected to the self-capacitance electrode 04 through a via hole extending through the insulation layer 07, and the anode layer 311 is electrically connected to the drain 15 of the thin-film transistor through a vial hole extending through the planarization layer 20.

In particular, in the embedded touch panel according to an embodiment of the present disclosure, it may be desirable to separately drive during the touch phase and during the display phase in order to reduce mutual interference between the display signal and the touch signal. In other words, the display panel does not display (i.e., it is black) during the touch duration, and the touch sensing chip does not output any signal during the display duration.

According to principle of self-capacitance touch control, the base capacitance of the self-capacitance electrode (i.e., the capacitance between the self-capacitance electrode and the ground electrode) is a fixed value when the human body does not touch the panel, while the capacitance of the self-capacitance electrode is the base capacitance plus the body capacitance when the human body touches the panel. Therefore, it is possible for the touch sensing chip to determine the touch position by detecting variation in capacitance value of each of the self-capacitance electrodes during touch duration. In a self-capacitance touch panel, however, the variation in capacitance caused by human body touching the panel is relatively small if the self-capacitance electrode per se has a relatively large capacitance, which may affect signal to interference ratio for touch control.

Therefore, in the embedded touch panel according to an embodiment of the present disclosure, it is desirable to configure such that signals on all ground electrodes are the same as the signals on the self-capacitance electrode during the touch duration, i.e., all electrodes in the pixel circuit output the same signal as the self-capacitance electrode at the same time, so as to reduce the base capacitance of the self-capacitance electrode.

Figure 7A:
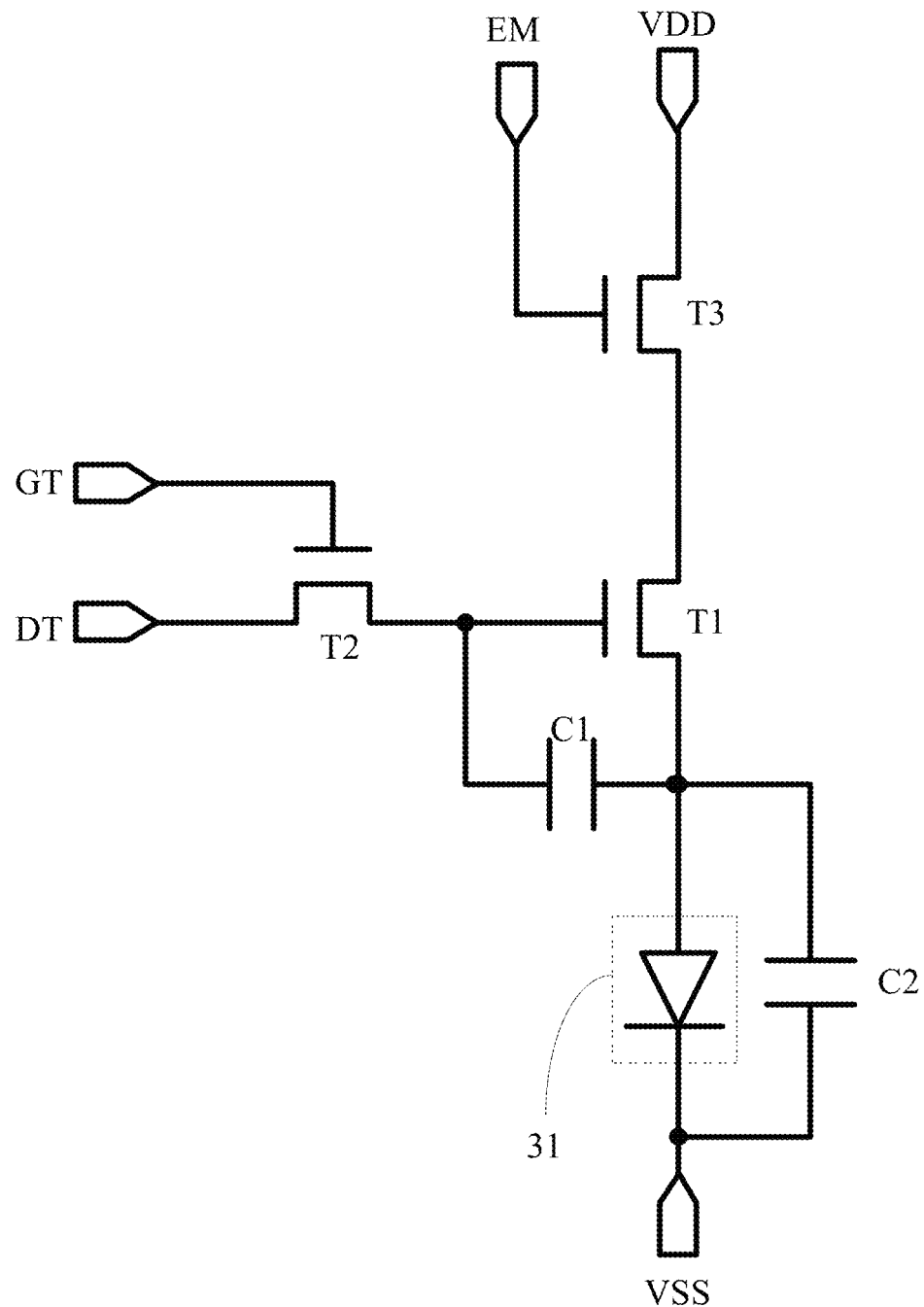
FIG. 7a is a schematic view illustrating structure of the pixel circuit of the embedded touch panel according to an embodiment of the present disclosure.
Figure 7B:
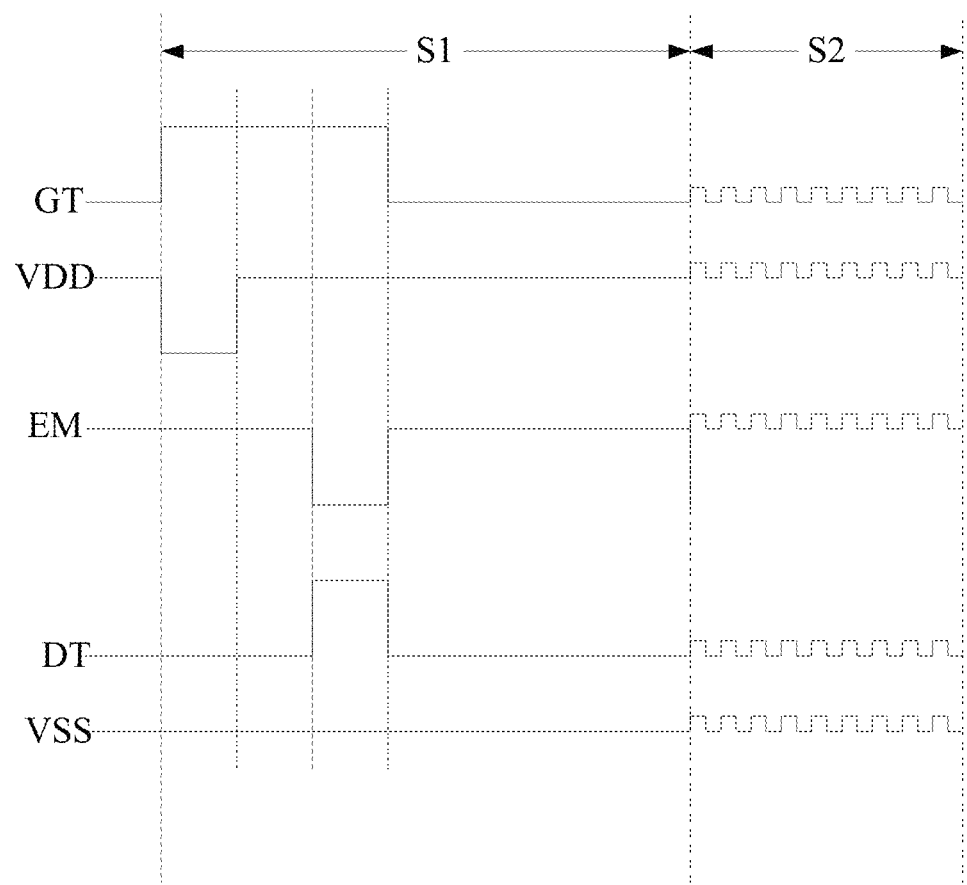

FIG. 7b shows an input signal sequence diagram corresponding to the pixel circuit in FIG. 7a. During the display duration S1, the various signal terminals (GT, DT, EM, VDD and VSS) of the pixel circuit are inputted corresponding display signals. During the touch duration S2, the various signal terminals (GT, DT, EM, VDD and VSS) of the pixel circuit are inputted a touch scanning signal which is the same with the signal on the self-capacitance electrode.

It would be appreciated that FIG. 7a is only intended to illustrate signals on the respective signal terminals of the pixel circuit during the touch duration. The pixel circuit in the embedded touch panel according to the embodiments of the present disclosure is not limited to the structure shown in FIG. 7a and may be any suitable pixel circuit capable of displaying.

An embodiment of the present disclosure also provides a display device comprising the embedded touch panel described above. Such display device may be any product or component having display function, such as a mobile phone, a tablet, a TV, a display, a laptop, a digital photo frame, a navigator, or the like. For details of the display device, refer to foregoing embodiments described in connection with the embedded touch panel. Herein detailed description will be omitted.

In the embedded touch panel and the display device according to the embodiments of the present disclosure, by adopting the bottom-emitting OLED pixel structure, providing self-capacitance electrodes between the pixel unit and the lower substrate, and arranging the wire between the lower substrate and the OLED pixel structure, there is no need for the electrical connection between the wire and the self-capacitance electrode to penetrate the OLED pixel structure, thus reducing complexity of the manufacturing process and lowering down the production cost.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:
1. An embedded touch panel comprising:
an upper substrate;
a lower substrate opposite to the upper substrate, the lower substrate including a display region and a non-display region adjacent to the display region;
multiple pixel units positioned on a plane of the lower substrate facing the upper substrate in the display region, wherein each of the pixel units comprises a bottom-emitting OLED pixel structure and a pixel circuit;
a plurality of independent self-capacitance electrodes positioned in the display region and between the lower substrate and the pixel units, and insulated from the pixel units;
a touch sensing chip positioned on the plane of the lower substrate facing the upper substrate in the non-display region to determine a touch position by detecting a change in capacitance of each of the self-capacitance electrodes during a touch duration; and
multiple wires disposed between the self-capacitance electrodes and the pixel circuits, each of the wires connecting a corresponding one of the self-capacitance electrodes to the touch sensing chip.

2. The embedded touch panel according to claim 1, wherein each self-capacitance electrode includes a grid shape.

3. The embedded touch panel according to claim 2, wherein each self-capacitance electrode comprises metal.

4. The embedded touch panel according to claim 3, further comprising a black matrix area disposed between the upper substrate and the lower substrate, and between adjacent OLED pixel structures, wherein a positive projection of the black matrix area onto the lower substrate covers a positive projection of the self-capacitance electrodes onto the lower substrate.

5. The embedded touch panel according to claim 1, wherein each self-capacitance electrode comprises a transparent electrically conductive material.

6. The embedded touch panel according to claim 5, wherein each self-capacitance electrode includes a block shape, and wherein a positive projection of the self-capacitance electrodes onto the lower substrate covers a positive projection of at least one of the pixel units onto the lower substrate.

7. The embedded touch panel according to claim 1, wherein each of the wires is arranged at the same layer as an electrode in the pixel circuit and comprises the same material as the electrode in the pixel circuit, and wherein each of the wires is electrically connected to its corresponding self-capacitance electrode through a via hole.

8. The embedded touch panel according to claim 1, wherein each wire is arranged at the same layer as its corresponding self-capacitance electrode and comprises the same material as its corresponding self-capacitance electrode.

9. The embedded touch panel according to claim 1, further comprising an insulation layer positioned between the self-capacitance electrodes and the pixel units.

10. The embedded touch panel according to claim 9, wherein the OLED pixel structure comprises an anode layer, an organic light-emitting layer and a cathode layer, which are sequentially layered on the insulation layer.

11. The embedded touch panel according to claim 10, wherein the OLED pixel structure further comprises a pixel defining layer disposed around the anode layer and the organic light-emitting layer.

12. The embedded touch panel according to claim 10, further comprising a thin-film transistor disposed between the insulation layer and the OLED pixel structure, wherein the thin-film transistor comprises a gate, a gate insulation layer, an active layer, a source and a drain, which are sequentially disposed on the insulation layer, and wherein the source and the drain are positioned at the same layer.

13. The embedded touch panel according to claim 12, further comprising a planarization layer disposed between the OLED pixel structure and the gate insulation layer.

14. The embedded touch panel according to claim 13, wherein each wire is arranged at the same layer as the gate, and wherein each wire is electrically connected to its corresponding self-capacitance electrode through a via hole extending through the insulation layer.

15. The embedded touch panel according to claim 13, wherein the anode layer is electrically connected to the drain through a via hole extending through the planarization layer.

16. A display device comprising a display including the embedded touch panel according to claim 1.

* * * * *